United States Patent
Bailey et al.

(10) Patent No.: US 8,736,478 B2
(45) Date of Patent: May 27, 2014

(54) DIGITAL-TO-ANALOG CONVERTER

(75) Inventors: James A. Bailey, Snowflake, AZ (US); Abhishek Duggal, Emmaus, PA (US)

(73) Assignee: LSI Corporation, San Jose, CA (US)

(*) Notice: Subject to any disclaimer, the term of this patent is extended or adjusted under 35 U.S.C. 154(b) by 98 days.

(21) Appl. No.: 13/415,898

(22) Filed: Mar. 9, 2012

(65) Prior Publication Data
US 2013/0234874 A1 Sep. 12, 2013

(51) Int. Cl.
*H03M 1/66* (2006.01)
(52) U.S. Cl.
USPC .......................... 341/150; 341/144; 341/152
(58) Field of Classification Search
USPC .................................. 341/150, 152
See application file for complete search history.

(56) References Cited

U.S. PATENT DOCUMENTS

| | | | |
|---|---|---|---|
| 4,571,572 A * | 2/1986 | Noda et al. | 341/126 |
| 7,129,876 B2 * | 10/2006 | Koyanagi | 341/144 |
| 7,623,054 B2 | 11/2009 | Iriguchi et al. | |
| 8,125,366 B2 * | 2/2012 | Pedersen | 341/152 |

* cited by examiner

*Primary Examiner* — Khai M Nguyen
(74) *Attorney, Agent, or Firm* — Mendelsohn, Drucker & Dunleavy, P.C.; Steve Mendelsohn

(57) ABSTRACT

A digital-to-analog converter (DAC) has a pulse-width encoder that generates a charging pulse having a pulse width proportional to the DAC's digital input value. The charging pulse controls a charging switch that selectively connects a current source to a capacitor for the duration of the charging pulse. At the end of the charging pulse, a voltage corresponding to the charge stored in the capacitor forms the DAC's analog output signal. Such DACs can be configured (1) with negative-gain amplifiers across the capacitor to form a negative feedback loop, (2) with multiple parallel current sources, and/or (3) in differential architectures.

18 Claims, 7 Drawing Sheets

DIGITAL-TO-ANALOG CONVERTER

BACKGROUND

This section introduces aspects that may help facilitate a better understanding of the invention. Accordingly, the statements of this section are to be read in this light and are not to be understood as admissions about what is prior art or what is not prior art.

A digital-to-analog converter (DAC) converts a digital input value into an analog output signal. It is desirable to design DACs that can operate with electronics having ever faster speed, ever smaller resolution, and ever better linearity, while consuming ever smaller area and power.

SUMMARY

In one embodiment of the disclosure, circuitry comprises a digital-to-analog converter (DAC) for converting a digital input value into a first analog output signal. The DAC comprises (1) a pulse-width encoder configured to generate a first charge pulse having a first pulse width proportional to the first digital input value, (2) a first current source, (3) a first capacitor configured to generate the first analog output signal, and (4) a first charging switch configured to selectively apply current from the first current source to the first capacitor based on the first charge pulse.

In another embodiment of the disclosure, a method for converting a digital input value into an analog output signal, comprises (a) converting the digital input value into a charge pulse, whose duration is proportional to the digital input value and (b) selectively applying current to a capacitor for the duration of the charge pulse, wherein the analog output signal is based on a voltage level at a plate of the capacitor at the end of the charge pulse.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Basic DAC Architecture

Figure 1:
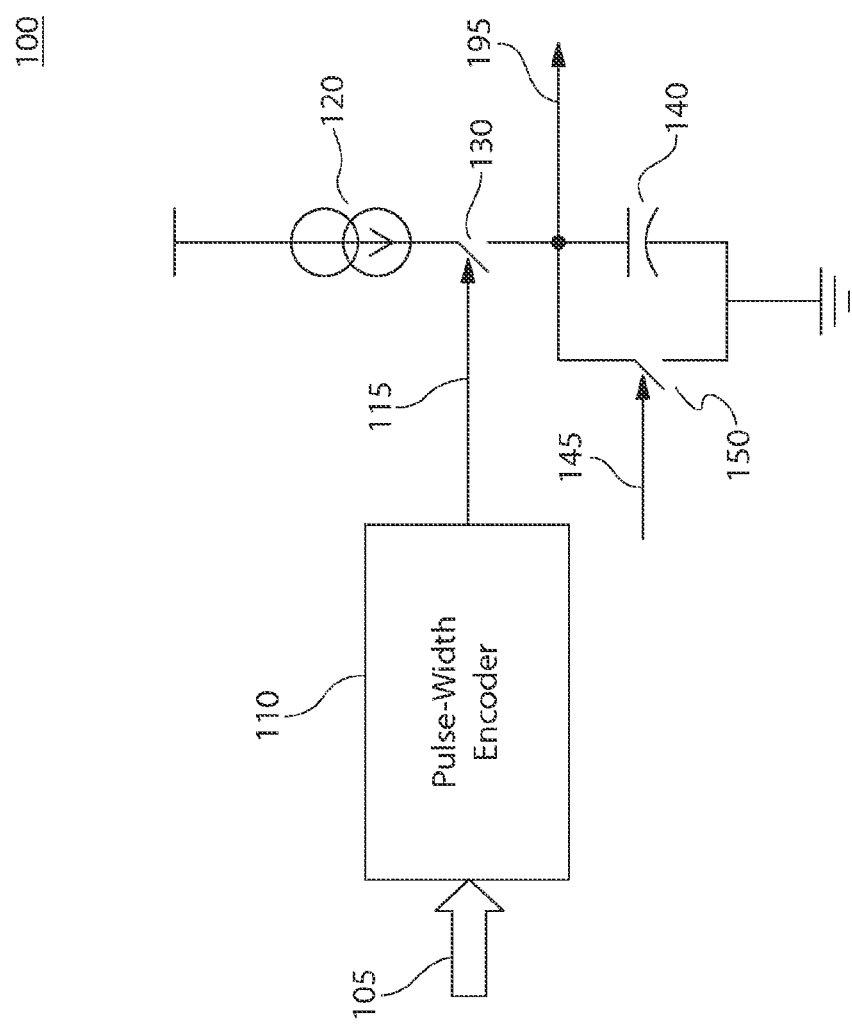
FIG. 1 shows a schematic block diagram of a digital-to-analog converter (DAC) according to one embodiment of the disclosure.

FIG. 1 shows a schematic block diagram of a digital-to-analog converter (DAC) 100 according to one embodiment of the disclosure. DAC 100 converts a digital input value 105 into an analog (voltage) output signal 195. DAC 100 is typically part of a larger integrated circuit having other circuitry, possibly including other instances of DAC 100. Although not represented in FIG. 1, that other circuitry includes upstream circuitry for generating the inputs to DAC 100 as well as downstream circuitry for receiving the output from DAC 100, possibly including an output buffer to drive analog output signal 195 into other downstream circuitry.

As shown in FIG. 1, pulse-width encoder 110 generates a charge-pulse signal 115 having a charge pulse whose duration (i.e., pulse width) is proportional to digital input value 105. In particular, the charge pulse width is equivalent to the product of the magnitude of digital input value 105 times the period of the clock signal (not shown) driving DAC 100. When charge-pulse signal 115 is low, charging switch 130 is open, and, when charge-pulse signal 115 is high, charging switch 130 is closed. Thus, for a given magnitude of digital input value 105, charging switch 130 is closed for the duration of the corresponding charge pulse.

Initially, charge-pulse signal 115 is low, and a reset pulse is generated in reset-pulse signal 145, which closes discharging switch 150, thereby discharging capacitor 140 and driving the voltage level of analog output signal 195 to zero.

Then, assuming that reset-pulse signal 145 is low and therefore discharging switch 150 is open, when charging switch 130 is closed, current from constant current source 120 flows to capacitor 140, which accumulates positive charge corresponding to the integrated amount of current applied to capacitor 140 during the time that charging switch 130 is closed. When charging switch 130 is opened as a result of charge-pulse signal 115 going low at the end of the charge pulse, since the bottom plate of capacitor 140 is grounded, the resulting positive charge stored in capacitor 140 appears at analog output signal 195 as a positive voltage level.

Before another value of digital input value 105 is processed by pulse-width encoder 110 to generate another charge pulse in signal 115, a reset pulse is generated in reset-pulse signal 145, which closes discharging switch 150, thereby discharging capacitor 140 and driving the voltage level of analog output signal 195 to zero.

In this way, DAC 100 sequentially generates analog output signal 195 to have a voltage level proportional to the magnitude of digital input value 105.

DAC with Negative Feedback Loop

Figure 2:
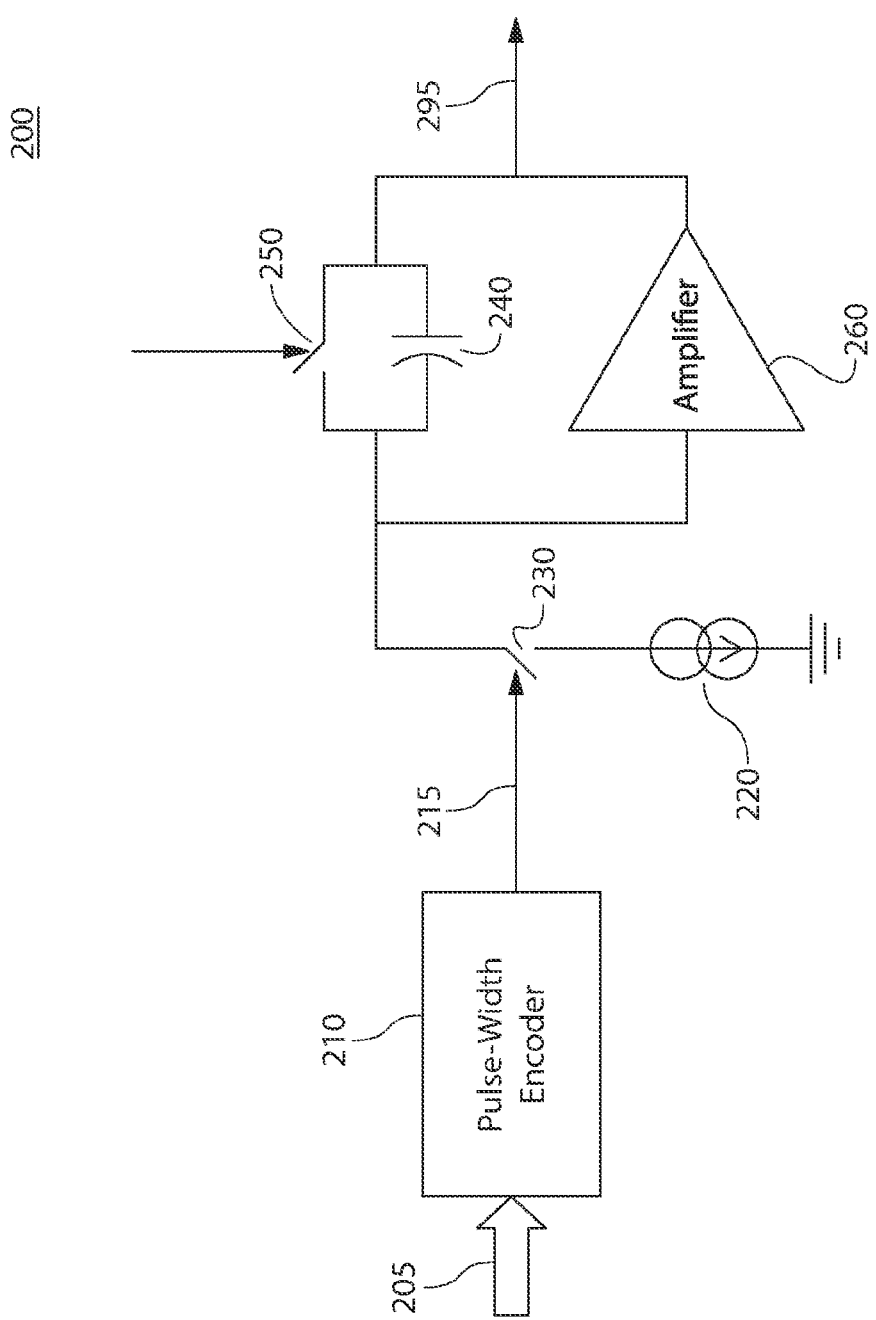
FIG. 2 shows a schematic block diagram of a negative-feedback DAC according to another embodiment of the disclosure.

FIG. 2 shows a schematic block diagram of a DAC 200 according to another embodiment of the disclosure. Like DAC 100 of FIG. 1, DAC 200 converts a digital input value 205 into an analog (voltage) output signal 295. DAC 200 is similar to DAC 100 with corresponding elements performing similar functions, except that, in DAC 200, (1) current source 220 functions as a current sink that draws charge away from capacitor 240 and (2) high input-impedance, high negative-gain amplifier 260 is connected to form a negative feedback loop across capacitor 240.

Thus, when charging switch 230 is closed at the beginning of a charge pulse in charge-pulse signal 215 generated by pulse-width encoder 210, current source 220 draws charge away from the left plate of capacitor 240 and away from the input of negative-gain amplifier 260, which in turn generates a positive output current, which causes positive charge to accumulate on the right plate of capacitor 240. When charging switch 230 is opened at the end of the charge pulse from pulse-width encoder 210, the positive charge stored in capacitor 240 will appear as a positive voltage level at analog output signal 295 that is proportional to digital input value 205.

Compared with the circuit in FIG. 1, providing the negative feedback loop with negative-gain amplifier 260 reduces the voltage range at the input of current source 220, thereby increasing the constancy of the current generated by current source 220, which, in turn, (i) increases the linearity of DAC 200 and (ii) enables a lower supply voltage to be used for the current source. The negative feedback loop also isolates the external load impedance at the analog output from the capacitor charging path without incurring the linearity degradation from an output buffer.

Figure 3:
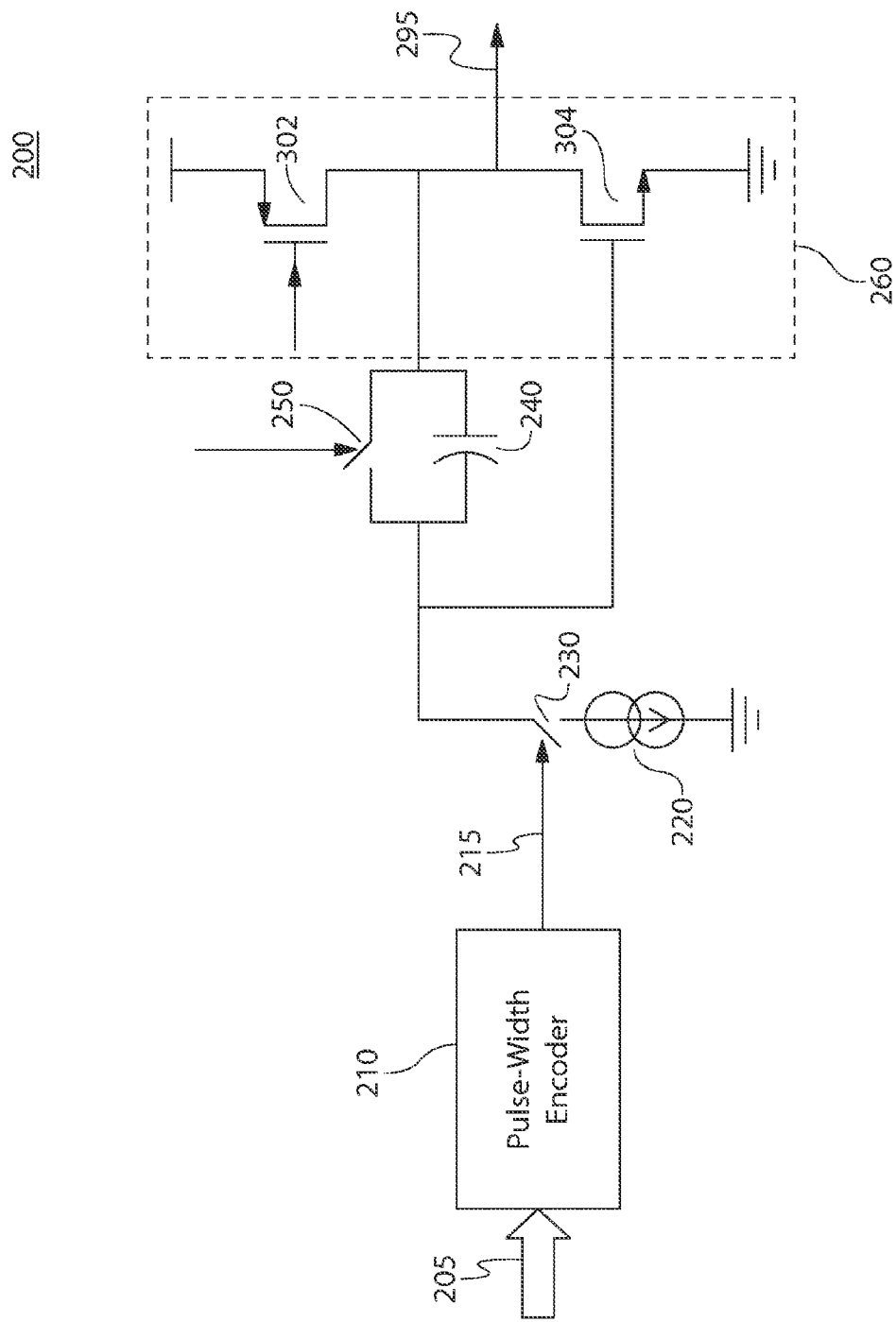
FIG. 3 shows a schematic block diagram of the negative-feedback DAC of FIG. 2 according to one possible implementation of its negative-gain amplifier.

FIG. 3 shows a schematic block diagram of DAC 200 of FIG. 2 according to one possible implementation of negative-gain amplifier 260. In this implementation, PMOS device 302 is biased into its saturation region to function as a constant current source with high output resistance.

When discharging switch 250 is closed, capacitor 240 is discharged, and the gate and drain of NMOS device 304 are connected to each other and to the analog output, which results in the NMOS device being diode-connected with (i) a positive voltage drop across the NMOS device from the analog output to ground and (ii) a positive voltage appearing at the gate of the NMOS device. The NMOS device is designed to operate in its saturation region with high output resistance.

When discharging switch 250 is opened, the positive voltage drop across NMOS device 304 is retained along with the positive voltage at the gate of the NMOS device, with all of the current from current-source PMOS device 302 flowing through the NMOS device.

When charging switch 230 is closed at the beginning of a charging pulse, the current from PMOS device 302 is split between (i) NMOS device 304 and (ii) the path through capacitor 240 and current source 220, which latter portion of current starts to charge the capacitor, with the left plate of capacitor 240 being driven towards ground and the right plate accumulating positive charge. The magnitude of current flowing through the capacitor is fixed and equal to the magnitude of the current generated by current source 220. Due to the high negative gain of the amplifier, a slight reduction of the gate voltage at NMOS device 304 produces a relatively large increase in the analog output voltage. The increasing charge stored in the capacitor corresponds to an increasing voltage across the plates of the capacitor and also corresponds to an increasing voltage difference between the analog output and the gate of the NMOS device. Due to the high negative gain of the amplifier, there is almost no change in the voltage at the gate of the NMOS device, and almost all of the change in voltage occurs at the analog output.

When charging switch 230 is opened at the end of the charging pulse, all of the current from PMOS device 302 will flow through NMOS device 304, the charge previously stored in capacitor 240 will be retained, and the final voltage at the analog output will be held. The final voltage appearing at analog output signal 295 relative to the initial reset voltage at the analog output is proportional to digital input value 205.

The single-ended DAC of FIGS. 2 and 3 can be modified to function as a differential DAC by adding a single-ended-to-differential converter at the output of the single-ended DAC.

Differential DAC with Negative Feedback Loop

Figure 4:
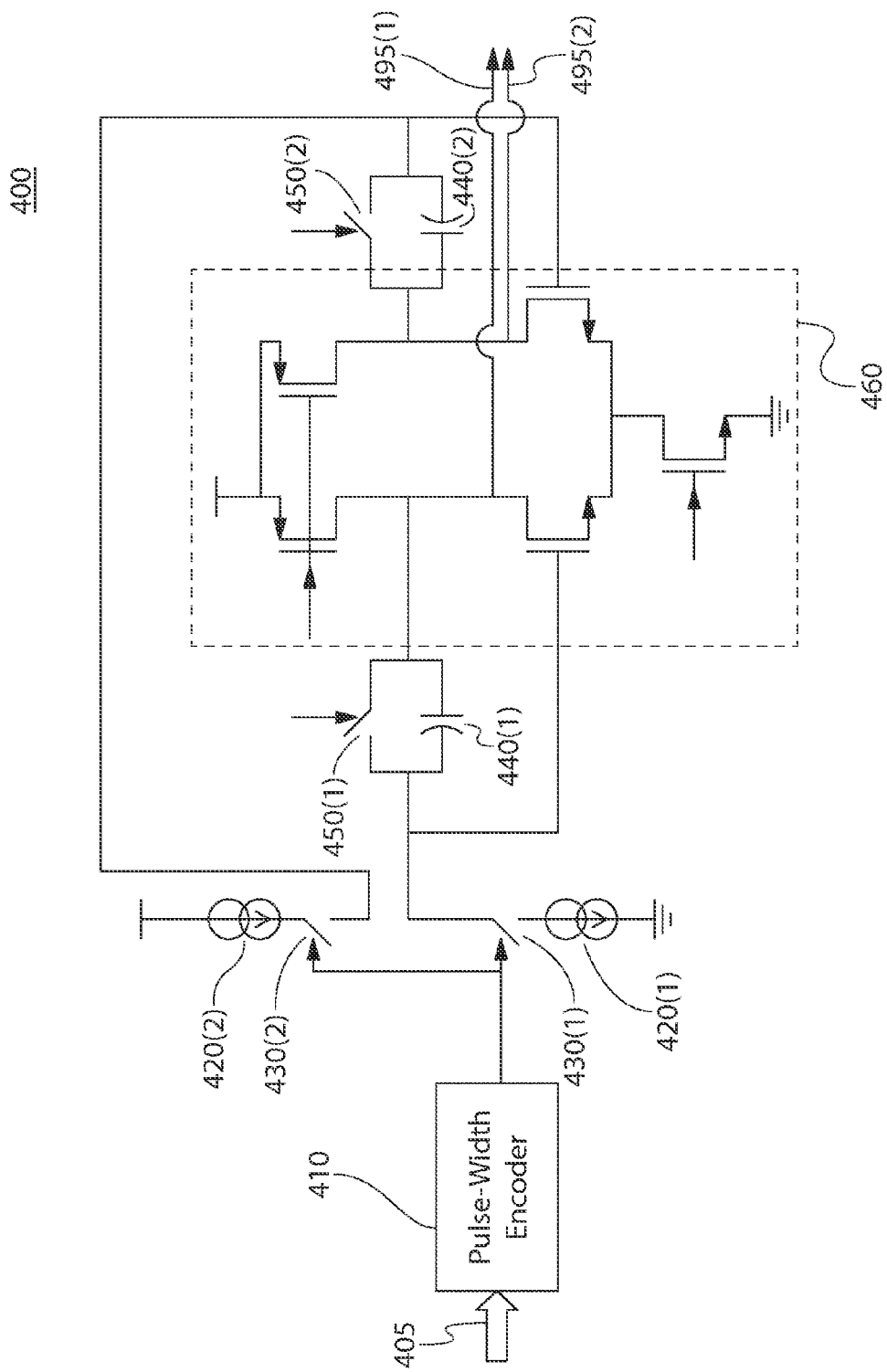
FIG. 4 shows a schematic block diagram of a differential, negative-feedback DAC according to another embodiment of the disclosure.

FIG. 4 shows a schematic block diagram of a DAC 400 according to another embodiment of the disclosure. DAC 400 is a differential DAC based on the negative-feedback architecture of single-ended DAC 200 of FIGS. 2 and 3. As such, DAC 400 converts digital input value 405 into differential analog output signal 495 having two components 495(1) and 495(2).

As shown in FIG. 4, DAC 400 has two current sources 420(1) and 420(2), two charging switches 430(1) and 430(2), two capacitors 440(1) and 440(2), and two discharging switches 450(1) and 450(2). Pulse-width encoder 410 generates a single charge-pulse signal DS which is applied to both charging switches 430(1) and 430(2). Note that, in differential DAC 400, current source 420(1) functions as a current sink (as in DAC 200 of FIGS. 2 and 3), while current source 420(2) functions as a current source (as in DAC 100 of FIG. 1). Note further that, in differential DAC 400, amplifier 460 is a conventional differential amplifier configured to provide appropriate negative feedback to both capacitors 440(1) and 440(2).

Current source 420(1), charging switch 430(1), capacitor 440(1), discharging switch 450(1), and the corresponding MOS devices in amplifier 460 function in a manner similar to the corresponding elements of DAC 200 of FIGS. 2 and 3, resulting in positive charge accumulating on the right plate (as illustrated in FIG. 4) of capacitor 440(1) and a corresponding high voltage appearing at analog output signal component 495(1). At the same time, current source 420(2), charging switch 430(2), capacitor 440(2), discharging switch 450(2), and the corresponding MOS devices in amplifier 460 function in a manner similar to the corresponding elements of a negative feedback implementation of DAC 100 of FIG. 1, resulting in negative charge accumulating on the left plate (as illustrated in FIG. 4) of capacitor 440(2) and a corresponding low voltage appearing at analog output signal component 495(2).

Although not represented in the implementation of FIG. 4, differential DACs of the disclosure may be implemented with circuitry to control the common-mode voltage of the output signal, circuitry to eliminate the differential offset of the output signal, and/or circuitry to use a sign bit of the digital input value to invert the polarity of the analog output signal. For example, for a differential DAC having common-mode-voltage circuitry, when current sources 420(1) and 420(2) generate equivalent charging currents and when capacitors 440(1) and 440(2) have equivalent capacitances, analog output signal 495 can be a substantially symmetrical differential signal having a desired common-mode voltage level.

Pulse-Width Encoder

Figure 5:
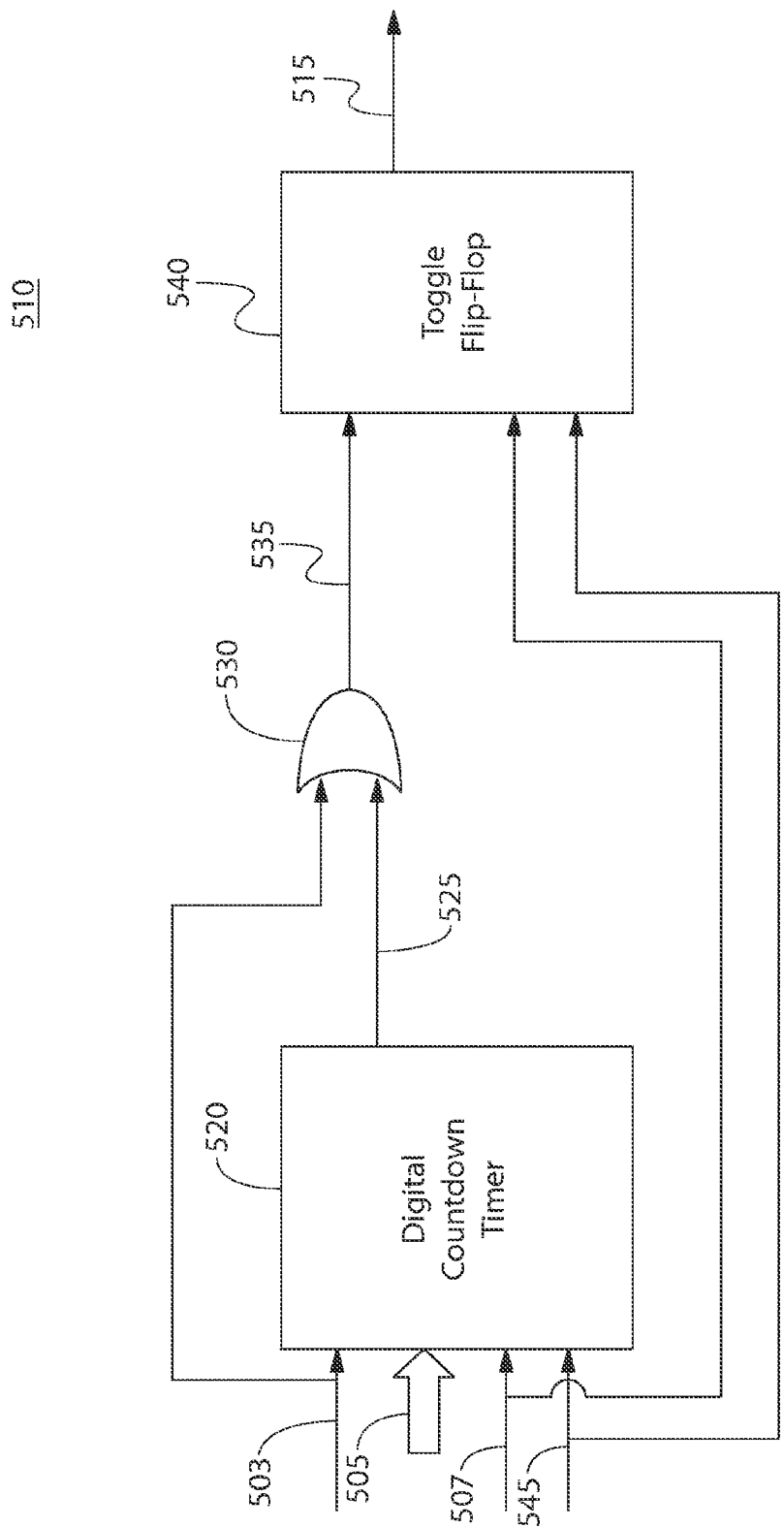
FIG. 5 shows a schematic block diagram of a pulse-width encoder that can be used to implement each of the pulse-width encoders of FIGS. 1-4.

FIG. 5 shows a schematic block diagram of a pulse-width encoder 510 that can be used to implement each of pulse-width encoders 110, 210, and 410 of FIGS. 1-4. Pulse-width encoder 510 converts digital input value 505 into charge-pulse signal 515. It will be understood that other designs for pulse-width encoders can alternatively be used in DACs 100, 200, and 400.

As shown in FIG. 5, digital countdown timer 520 receives load-pulse signal 503, digital input value 505, clock signal 507, and reset-pulse signal 545. Digital countdown timer 520 initiates an internal counter to be equal to the magnitude of digital input value 505. When load-pulse signal 503 has a load pulse (having a pulse width equivalent to one period of clock signal 507), digital countdown timer 520 begins to decrement its counter by one for each subsequent clock period until the counter reaches zero. When the counter reaches zero, digital countdown timer 520 generates an end-count pulse in end-count-pulse signal 525 having a pulse width of one clock period.

OR gate 530 receives both load-pulse signal 503 and end-count-pulse signal 525 and generates toggle-pulse signal 535, which will contain a pulse whenever either of signals 503 and 525 contain a pulse. Thus, when load-pulse signal 503 contains the load pulse that initiates the counting of countdown timer 520, toggle-pulse signal 535 will also contain a toggle pulse, which causes toggle flip-flop 540 to drive charge-pulse signal 515 high. Later, when end-count-pulse signal 525 contains an end-count pulse indicating that countdown timer 520 has finished its counting, toggle-pulse signal 535 will also contain another toggle pulse, which causes toggle flip-flop 540 to drive charge-pulse signal 515 low, resulting in signal 515 having a charge pulse whose pulse width is proportional to the magnitude of digital input value 505.

A reset pulse in reset-pulse signal 545 will reset both digital countdown timer 520 and toggle flip-flop 540. Resetting digital countdown timer 520 resets the internal counter to zero and ensures that end-count-pulse signal 525 is low. Similarly, resetting toggle flip-flop 540 ensures that charge-pulse signal 515 is low.

Note that pulse-width encoder 510 can generate a charging pulse having a minimum pulse width as short as one clock period, which limits the resolution of the corresponding DAC analog output signal to a voltage level equivalent to the amount of charge accumulated in the capacitor during one clock period. A faster clock with a shorter clock period will allow for a smaller DAC output voltage resolution.

Negative-Feedback DAC Having Multiple Current Sources

Figure 6:
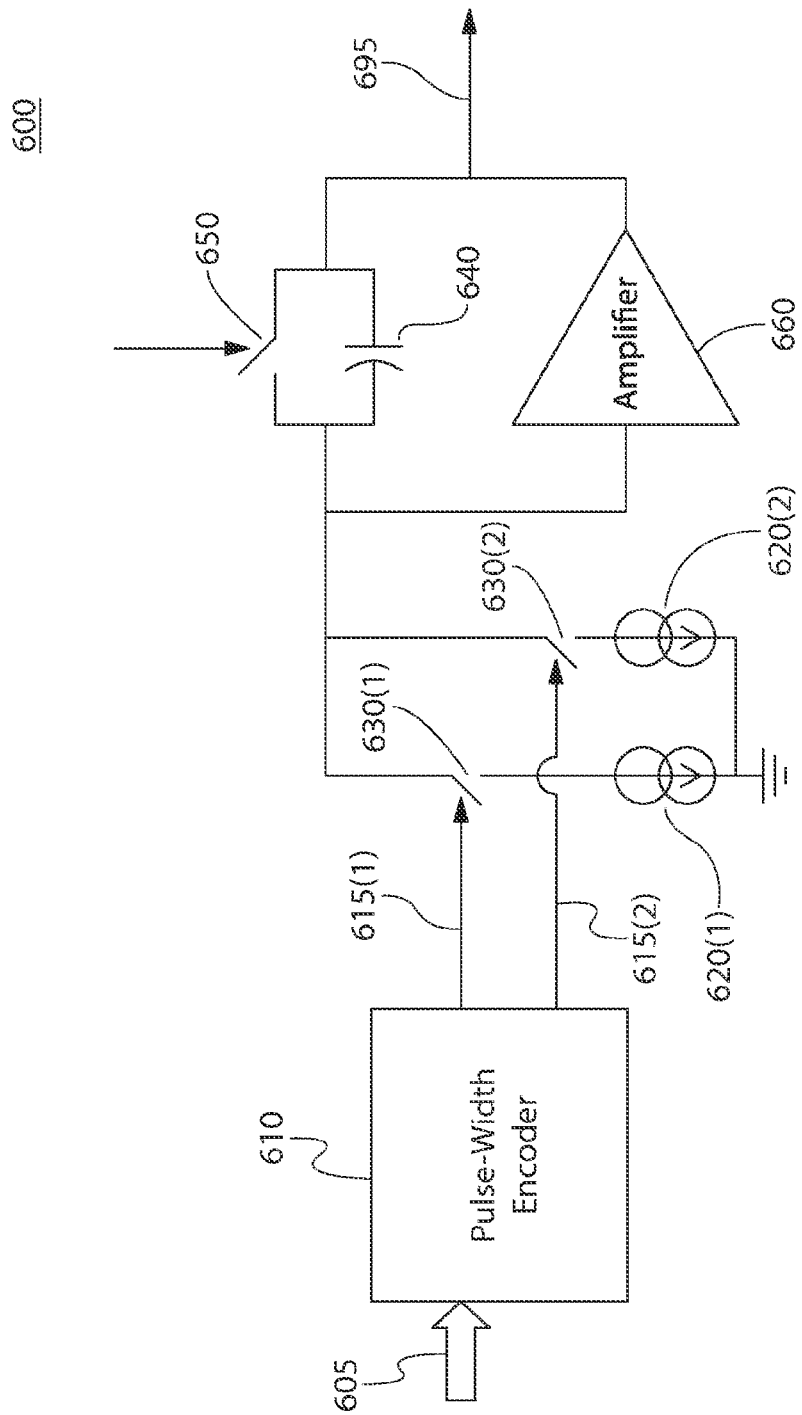
FIG. 6 shows a schematic block diagram of a negative-feedback DAC having multiple current sources according to another embodiment of the disclosure.

FIG. 6 shows a schematic block diagram of a DAC 600 according to another embodiment of the disclosure. Like DAC 200 of FIG. 2, DAC 600 is a negative-feedback DAC having a high-impedance, negative-gain amplifier 660. Unlike DAC 200, however, DAC 600 has two current sources 620(1) and 620(2) and two corresponding charging switches 630(1) and 630(2) configured in parallel with one another to capacitor 640, discharging switch 650, and amplifier 660. In addition, in DAC 600, pulse-width encoder 610 generates two charge-pulse signals 615(1) and 615(2) for controlling charging switches 630(1) and 630(2), respectively, where the charge pulses in signals 615(1) and 615(2) can be different. In alternative embodiments, DACs can be designed to have more than two switched current sources configured in parallel.

Configuring DAC 600 with two parallel, switched current sources 620 can reduce the total charging time and thereby increase the DAC conversion speed without reducing the resolution of the DAC's analog output signal 695.

Figure 7:
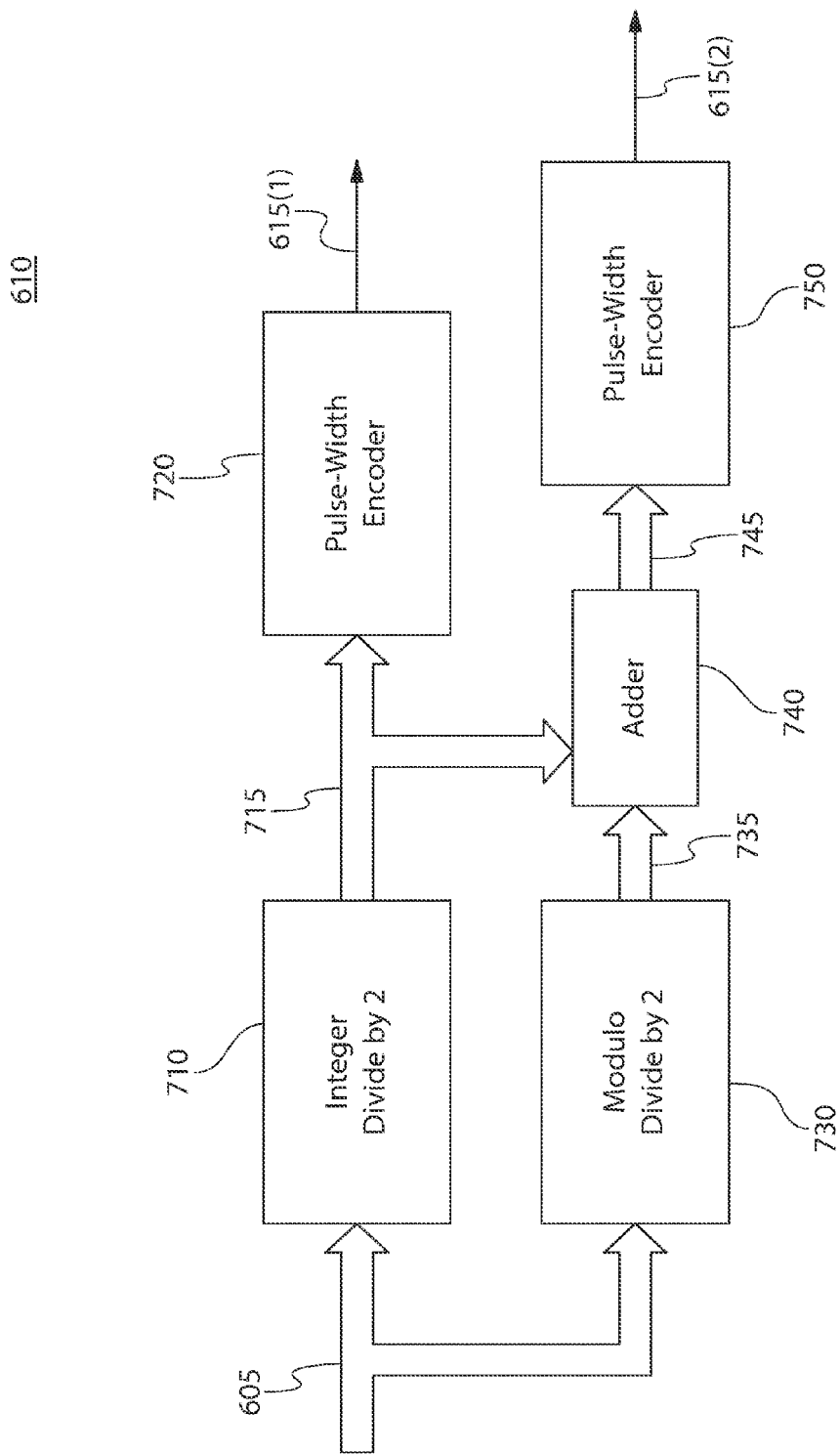
FIG. 7 shows a block diagram of the pulse-width encoder of FIG. 6, according to one embodiment of the disclosure.

FIG. 7 shows a block diagram of pulse-width encoder 610 of FIG. 6, according to one implementation. Other implementations are also possible.

As shown in FIG. 7, integer divider 710 applies integer division by 2 to digital input value 605 to generate first quotient value 715, which first pulse-width encoding module 720 converts into a charge pulse in first charge-pulse signal 615(1) having a pulse width proportional to half the magnitude of digital input value 605.

Modulo divider 730 applies modulo division by 2 to digital input value 605 to generate remainder value 735, which is added to first quotient value 715 by adder 740 to generate second quotient value 745, which second pulse-width encoding module 750 converts into a charge pulse in second charge-pulse signal 615(2). If digital input value 605 is an even number, then remainder value 735 will be zero, and the charge pulse in second charge-pulse signal 615(2) will have the same pulse width as the charge pulse in first charge-pulse signal 615(1). If, however, digital input value 605 is an odd number, then remainder value 735 will be one, and the charge pulse in second charge-pulse signal 615(2) will have a pulse width that is one clock period longer than the pulse width of the charge pulse in first charge-pulse signal 615(1).

Although DAC 600 of FIG. 6 is designed to have two identical current sources 620(1) and 620(2) generating charging currents of the same magnitude, in alternative DAC implementations, the charging currents may be different. In such cases, the design of pulse-width encoder will also be appropriately different to ensure that the total charge applied to the capacitor is proportional to the magnitude of the digital input value.

Broadening

Note that the architecture of each of single-ended DACs 100 and 600 of FIGS. 1 and 6, respectively, can be modified to form a differential DAC, analogous to the way that the architecture of single-ended DAC 200 of FIGS. 2 and 3 was modified to form differential DAC 400 of FIG. 4.

Although the disclosure has been described in the context of DAC embodiments in which charging and discharging switches are closed when their control signals are high, and open when their control signals are low, it will be understood that alternative DAC embodiments could be designed in which those switches are closed by low control signals and opened by high control signals.

Similarly, although the disclosure has been described in the context of single-ended DAC embodiments that generate analog output signals having positive voltage levels, it will be understood that alternative single-ended DAC embodiments could be designed to generate analog output signals having negative voltage levels.

The embodiments of the invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors. In addition, switches may be implemented as individual transistors or as transistor-based transmission gates.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the invention is implemented using bi-polar transistor technology.

It should be appreciated by those of ordinary skill in the art that any block diagrams herein represent conceptual views of illustrative circuitry embodying the principles of the invention.

Unless explicitly stated otherwise, each numerical value and range should be interpreted as being approximate as if the word "about" or "approximately" preceded the value of the value or range.

It will be further understood that various changes in the details, materials, and arrangements of the circuits, sub-circuits, and components which have been described and illustrated in order to explain embodiments of the invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. Circuitry comprising a digital-to-analog converter (DAC) for converting a digital input value into a first analog output signal, the DAC comprising:
   a pulse-width encoder configured to generate a first charge pulse having a first pulse width proportional to the first digital input value;
   a first current source;
   a first capacitor configured to generate the first analog output signal;
   a first charging switch configured to selectively apply current from the first current source to the first capacitor based on the first charge pulse; and
   a first amplifier connected to the first capacitor in a negative feedback loop, wherein:
      the first charging switch selectively connects the first current source to a first plate of the first capacitor;
      the first analog output signal corresponds to a voltage level at a second plate of the first capacitor;
      an input of the first amplifier is connected to the first plate of the first capacitor;
      an output of the first amplifier is connected to the second plate of the first capacitor; and
      the first amplifier comprises:
         a PMOS device, whose channel is connected to the second plate of the first capacitor and whose gate is connected to a bias voltage; and
         an NMOS device, whose channel is connected to the second plate of the first capacitor and whose gate is connected to the first plate of the first capacitor.

2. The circuitry of claim 1, wherein, when the first charge pulse is high, the first charging switch is closed, thereby connecting the first current source to the first plate of the first capacitor.

3. The circuitry of claim 1, further comprising a first discharging switch configured to selectively discharge the first capacitor.

4. The circuitry of claim 1, wherein:
   the first charging switch selectively connects the first current source to the first plate of the first capacitor; and
   the first analog output signal corresponds to a voltage level at the first plate.

5. The circuitry of claim 1, wherein the first amplifier is a negative-gain amplifier.

6. The circuitry of claim 1, further comprising:
   a second current source;
   a second capacitor configured to generate a second analog output signal; and
   a second charging switch configured to selectively apply current from the second current source to the second capacitor based on the first charge pulse, wherein the first and second analog output signals form a differential output signal.

7. The circuitry of claim 6, further comprising a differential amplifier connected to the first and second capacitors in negative feedback loops.

8. The circuitry of claim 1, wherein the pulse-width encoder comprises:
   a digital countdown timer configured to count down from the digital input value based on a load pulse and generate an end-count pulse indicating that the count-down is complete;
   an OR gate configured to receive the load pulse and the end-count pulse and generate a corresponding toggle pulse;
   a toggle flip-flop configured to receive the toggle pulse and generate the first charge pulse.

9. The circuitry of claim 8, wherein:
   when the load pulse occurs, digital countdown timer begins to count down from the digital input value, the toggle pulse is based on the load pulse, and the toggle flip-flop causes the charge pulse to go high; and
   when the digital countdown timer counts down to zero, digital countdown timer generates the end-count pulse, the toggle pulse is based on the end-count pulse, and the toggle flip-flop causes the charge pulse to go low.

10. The circuitry of claim 1, further comprising:
   a second current source; and
   a second charging switch configured to selectively apply current from the second current source to the first capacitor based on a second charge pulse.

11. The circuitry of claim 10, wherein the second charge pulse is different from the first charge pulse.

12. The circuitry of claim 10, wherein the pulse-width encoder comprises:

an integer divider configured to apply integer division by 2 to the digital input value to generate a first digital quotient value;

a first pulse-width encoding module configured to generate the first charge pulse based on the first digital quotient value;

a modulo divider configured to apply modulo division by 2 to the digital input value to generate a digital remainder value;

an adder configured to combine the first digital quotient value and the digital remainder value to generate a second digital quotient value; and a second pulse-width encoding module configured to generate the second charge pulse based on the second digital quotient value.

13. Circuitry comprising a digital-to-analog converter (DAC) for converting a digital input value into a first analog output signal, the DAC comprising:

a pulse-width encoder configured to generate a first charge pulse having a first pulse width proportional to the first digital input value;

a first current source;

a first capacitor configured to generate the first analog output signal;

a first charging switch configured to selectively apply current from the first current source to the first capacitor based on the first charge pulse;

a second current source;

a second capacitor configured to generate a second analog output signal; and a second charging switch configured to selectively apply current from the second current source to the second capacitor based on the first charge pulse, wherein the first and second analog output signals form a differential output signal.

14. The circuitry of claim 13, further comprising a differential amplifier connected to the first and second capacitors in negative feedback loops.

15. Circuitry comprising a digital-to-analog converter (DAC) for converting a digital input value into a first analog output signal, the DAC comprising:

a pulse-width encoder configured to generate a first charge pulse having a first pulse width proportional to the first digital input value;

a first current source;

a first capacitor configured to generate the first analog output signal; and a first charging switch configured to selectively apply current from the first current source to the first capacitor based on the first charge pulse, wherein the pulse-width encoder comprises:

a digital countdown timer configured to count down from the digital input value based on a load pulse and generate an end-count pulse indicating that the countdown is complete;

an OR gate configured to receive the load pulse and the end-count pulse and generate a corresponding toggle pulse;

a toggle flip-flop configured to receive the toggle pulse and generate the first charge pulse.

16. The circuitry of claim 15, wherein:

when the load pulse occurs, digital countdown timer begins to count down from the digital input value, the toggle pulse is based on the load pulse, and the toggle flip-flop causes the charge pulse to go high; and when the digital countdown timer counts down to zero, digital countdown timer generates the end-count pulse, the toggle pulse is based on the end-count pulse, and the toggle flip-flop causes the charge pulse to go low.

17. Circuitry comprising a digital-to-analog converter (DAC) for converting a digital input value into a first analog output signal, the DAC comprising:

a pulse-width encoder configured to generate a first charge pulse having a first pulse width proportional to the first digital input value;

a first current source;

a first capacitor configured to generate the first analog output signal;

a first charging switch configured to selectively apply current from the first current source to the first capacitor based on the first charge pulse;

a second current source; and a second charging switch configured to selectively apply current from the second current source to the first capacitor based on a second charge pulse, wherein the pulse-width encoder comprises:

an integer divider configured to apply integer division by 2 to the digital input value to generate a first digital quotient value;

a first pulse-width encoding module configured to generate the first charge pulse based on the first digital quotient value;

a modulo divider configured to apply modulo division by 2 to the digital input value to generate a digital remainder value;

an adder configured to combine the first digital quotient value and the digital remainder value to generate a second digital quotient value; and a second pulse-width encoding module configured to generate the second charge pulse based on the second digital quotient value.

18. The circuitry of claim 17, wherein the second charge pulse is different from the first charge pulse.

* * * * *